United States Patent
Liang et al.

(10) Patent No.: US 9,419,405 B2
(45) Date of Patent: Aug. 16, 2016

(54) UNIDIRECTIONAL RING LASERS

(71) Applicant: HEWLETT-PACKARD DEVELOPMENT COMPANY, L.P., Houston, TX (US)

(72) Inventors: Di Liang, Palo Alto, CA (US); David A. Fattal, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/811,385

(22) Filed: Jul. 28, 2015

(65) Prior Publication Data

US 2015/0333479 A1    Nov. 19, 2015

Related U.S. Application Data (63) Continuation of application No. 14/373,385, filed as application No. PCT/US2012/027107 on Feb. 29, 2012, now Pat. No. 9,130,342.

(51) Int. Cl.

| | |
|---|---|
| *H01S 3/083* | (2006.01) |
| *H01S 5/042* | (2006.01) |
| *H01S 5/10* | (2006.01) |
| *H01S 3/063* | (2006.01) |
| *H01S 5/02* | (2006.01) |
| *H01S 5/026* | (2006.01) |
| *H01S 5/065* | (2006.01) |

(Continued)

(52) U.S. Cl.
CPC ............. *H01S 3/083* (2013.01); *H01S 3/063* (2013.01); *H01S 5/042* (2013.01); *H01S 5/1028* (2013.01); *H01S 5/1071* (2013.01); *H01S 5/021* (2013.01); *H01S 5/026* (2013.01); *H01S 5/0656* (2013.01); *H01S 5/323* (2013.01); *H01S 5/4087* (2013.01)

(58) Field of Classification Search
CPC ....... H01S 3/083; H01S 5/042; H01S 5/1028; H01S 3/063; H01S 5/1071; H01S 5/0656; H01S 5/026; H01S 5/323; H01S 5/021
See application file for complete search history.

(56) References Cited

U.S. PATENT DOCUMENTS

| | | |
|---|---|---|
| 4,112,389 A | 9/1978 | Streifer et al. |
| 6,680,962 B2 | 1/2004 | Liu et al. |
| 6,959,028 B2 | 10/2005 | Jones |

(Continued)

FOREIGN PATENT DOCUMENTS

| | | |
|---|---|---|
| CN | 1675807 A | 9/2005 |
| CN | 101847830 A | 9/2010 |
| JP | 2000205863 A | 7/2000 |
| WO | WO 03015228 A1 | 2/2003 |
| WO | WO-2013035182 A1 | 3/2013 |

OTHER PUBLICATIONS

Choi, S.J. et al., Bus-coupled Microresonator Lasers, (Research Paper), Proceedings of SPIE, 2005, vol. 5738, pp. 285-294.

(Continued)

*Primary Examiner* — Dung Nguyen
(74) *Attorney, Agent, or Firm* — Tong, Rea, Bentley & Kim, LLC (57) ABSTRACT

A laser includes an active ring, a passive waveguide, and a reflector. The active ring is to generate light. The passive waveguide is associated with the active ring to capture generated light. The reflector is associated with the passive waveguide to cause captured light from the waveguide to be coupled into the active ring to trigger domination of unidirectional lasing in the active ring to generate light.

14 Claims, 9 Drawing Sheets

(51) Int. Cl.
*H01S 5/323* (2006.01)
*H01S 5/40* (2006.01)

(56) References Cited

U.S. PATENT DOCUMENTS

| | | | |
|---|---|---|---|
| 7,664,156 B2 | 2/2010 | Yamazaki | |
| 7,773,642 B2 | 8/2010 | Yamazaki | |
| 7,817,702 B2 | 10/2010 | Behfar et al. | |
| 9,130,342 B2* | 9/2015 | Liang | H01S 5/1071 |
| 2002/0105998 A1 | 8/2002 | Ksendzov | |
| 2003/0021302 A1 | 1/2003 | Grudinin et al. | |
| 2003/0108080 A1 | 6/2003 | Behfar | |
| 2003/0202555 A1 | 10/2003 | Liu et al. | |
| 2003/0219045 A1 | 11/2003 | Orenstein et al. | |
| 2006/0153268 A1* | 7/2006 | Yu | G02B 6/12004 |
| | | | 372/94 |
| 2009/0191657 A1 | 7/2009 | Yang et al. | |
| 2014/0097361 A1* | 4/2014 | Hartsuiker | C03C 25/12 |
| | | | 250/492.1 |
| 2014/0133512 A1 | 5/2014 | Akiyama | |

OTHER PUBLICATIONS

International Search Report & Written Opinion, Oct. 29, 2012, peT Patent Application No. PCT/US2012/027107, 10 pages.

Lang, D. et al., Electrically-pumped Compact Hybrid Silicon Microring Lasers for Optical Interconnects, (Research Paper), Optics Express, Oct. 26, 2009, vol. 17, No. 22, pp. 20355-20364.

Cho, S. H. et al., "Unidirectionality of Semiconductor Ring Lasers: Theory and Experiment," Semiconductor Laser Conference, 2002. IEEE 18th International, pp. 69-70.

Extended European Search Report received in EP Application No. 12870271.9, Dec. 16, 2015, 10 pages.

Hohimer, J. P. et al, "Improving The Performance of Semiconductor Ring Lasers By Controlled Reflection Feedback," Applied Physics Letters 61.9, Aug. 31, 1992, pp. 1013-1015.

Zheng, Y. et al., "Electrically Pumped Heterogeneously Integrated Si/III-V Evanescent Lasers With Micro-Loop Mirror Reflector." Applied Physics Letters 99.1, Jul. 5, 2011.

* cited by examiner

UNIDIRECTIONAL RING LASERS

BACKGROUND

A traveling-wave resonator laser, such as a ring laser, may be associated with bidirectional lasing in two counter-propagating directions. The resonator may unpredictably lase in either or both directions, regardless of input current biasing level, thereby reducing laser emission efficiency in a desired direction.

DETAILED DESCRIPTION

Laser applications may include optical interconnects, e.g., photonic data links, where unidirectional lasing may be desirable for efficient and robust signal communication. Unidirectional lasing may be achieved based on the following examples, even when using a laser cavity where lasing can take place at two counter-propagating directions, simultaneously or alternatively, due to the fundamental traveling-wave nature of the laser cavity. Example laser systems may trigger domination of unidirectional lasing in a traveling-wave resonator (e.g., a laser cavity) based on a reflector associated with a waveguide coupled to the resonator to emit light. The reflector may encourage and/or promote unidirectional lasing domination in a preferred direction, by feeding/building lasing in the preferred direction to break symmetry/energy balance in the laser resonator cavity and lead to unidirectional domination.

Domination of unidirectional lasing may be associated with a gain/loss imbalance, or other asymmetry and/or manipulation, of the energy balance associated with the counter-propagating directions. Thus, the domination of unidirectional lasing is to favor a lasing direction by using available energy in the resonator for that lasing direction, while shutting off lasing in the other direction. Example lasers may be based on other traveling-wave resonators besides microrings. Thus, systems based on the example below may enable low power consumption, high modulation speeds, small footprints, and flexibility to form wavelength division multiplexing (WDM) light sources.

In an example, a laser system may include an active ring, a passive waveguide, and a reflector. The active ring is to generate light, e.g., based on a gain medium responsive to energy pumped into the active ring. The passive waveguide is associated with the active ring to capture generated light. The passive waveguide may be a bus waveguide, and the active ring may be coupled to the passive waveguide at a coupling point on the passive waveguide. The reflector associated with the passive waveguide is to cause captured light from the waveguide to be coupled into the active ring to trigger domination of unidirectional lasing in the active ring to generate light. In an example, the reflector may reflect light emissions in one direction from the waveguide back to the active ring to trigger domination of lasing in the active ring in another direction. Reflectors may be complementary metal-oxide-semiconductor (CMOS) compatible, and may be formed during fabrication of ring lasers and/or other components without adding complexity or cost (e.g., based on lithography). The laser systems may have a very small footprint and enable dense integration.

Figure 1:
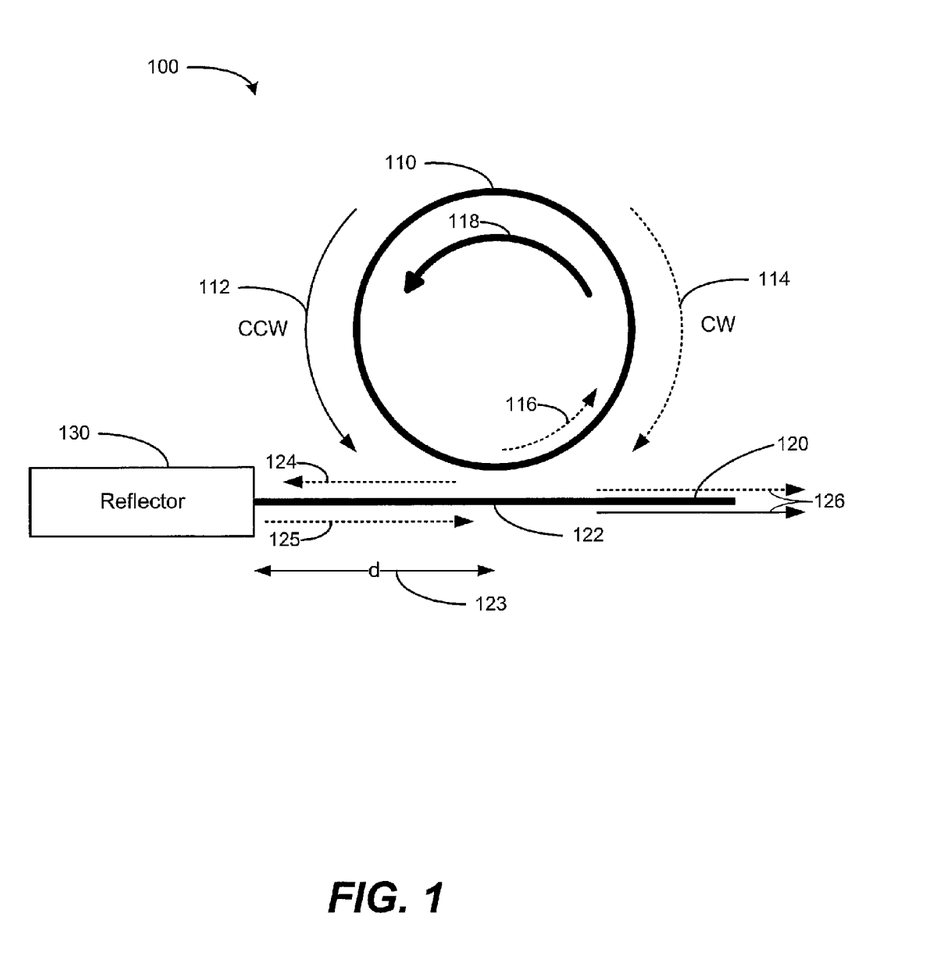
FIG. 1 is a block diagram of a laser including a reflector according to an example.

FIG. 1 is a block diagram of a laser 100 including a reflector 130 according to an example. The reflector 130 is associated with waveguide 120. The waveguide 120 is coupled to active ring 110 at coupling point 122. The reflector 130 is positioned a distance d 123 from the coupling point 122.

The active ring 110 is to generate light in response to energy pumped into the active ring 110. For example, the active ring 110 may be an electrically-driven hybrid silicon microring (e.g., a ring structure having III-V material gain epitaxial layers bonded to a substrate) having electrodes to receive an injection current from an external energy pump such as a current source. In alternate examples, the active ring 110 may generate light based on energy received from an optical energy pump. The active ring 110 may generate light bidirectionally, e.g., in counterclockwise 112 and/or clockwise 114 directions, and the directionality of light generation may be unpredictable due to characteristics of traveling-wave resonators such as a microing laser cavity.

In a laser resonator cavity, intensity of generated light is related to power level of energy pumped into the ring (e.g., a level of injection current or level of pump light intensity), such that intensity of generated light increases as energy pumping level increases. However, due to the bidirectional nature of the light propagation in a ring cavity, the directionality light generation in the active ring 110 could begin as simultaneously bidirectional, then switch to clockwise 114 (or counterclockwise 112), then switch to counterclockwise 112 (or counterclockwise 114), whether input power is varied or held constant. Dominant lasing direction may be related to carrier injection level or other energy pumping into the laser cavity, but may be unpredictable when no steps are taken to break the physical symmetry (e.g., equal gain and loss) associated with the two lasing directions.

The laser 100 is to provide emitted light 126 to/from the waveguide 122. Thus, it is desirable to trigger domination of unidirectional lasing 118 consistent with the desired direction of emitted light 126. Reflector 130 may be used to trigger domination of unidirectional lasing 118. Clockwise 114 and counterclockwise 112 lasing may occur at the same or similar wavelengths.

Light from clockwise 114 light generation may be coupled, including partially coupled, to the waveguide 120 as captured light 124. Reflector 130 may reflect, including partially reflected, the captured light 124, as reflected light 125. The reflected light 125 may be coupled, including partially coupled, into the active ring 110 as coupled light 116, traveling in the counterclockwise 112 direction. The coupled light 116 is to unbalance the counterclockwise 112 and clockwise 114 light generation in the active ring 110, and trigger domination of unidirectional lasing 118. Unidirectional lasing 118 enables the active ring 110 to efficiently convert received pump energy into emitted light 126. Reflected light 125, including a portion remaining that is not coupled into the active ring 110, may remain in the waveguide 120 and join with outcoupled counterclockwise 112 emissions (including emissions based on domination of unidirectional lasing). The joined light may have identical or similar wavelengths, based on various factors including active ring 110, external energy pump, distance d, waveguide 120, coupling point 122, distance between the active ring 110 and waveguide 120, and other factors.

Although the illustrated examples show unidirectional lasing and light emission based on the counterclockwise direction, other examples may be based on the clockwise direction with corresponding changes to the arrangement of components such as the reflector.

FIGS. 2A-2E are block diagrams of reflectors 232A-232E according to examples. The reflectors may be added to an active ring and waveguide without having to modify the ring laser (e.g., without having to adjust internal losses of the active ring). Reflectors may be passive to operate without consuming power, and may be tuned based on heating them or applying current/charge to adjust the reflection bandwidth.

Figure 2A:
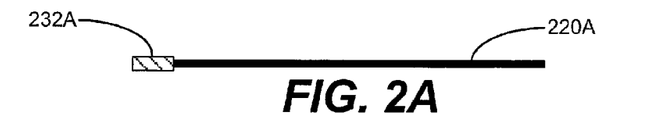
FIGS. 2A-2E are block diagrams of reflectors according to examples.

FIG. 2A shows a facet reflector 232A coupled to the waveguide 220A. The facet reflector 232A may include a reflection coating, such as a partial/low reflection and full/high reflection coating, and may be a smooth vertical facet. The facet reflector 232A may operate over the entire wavelength range supported by the laser, ring, and/or waveguide, or a subset of wavelengths. The facet reflector 232A may provide a compact reflector structure that may be fabricated on-chip with other components of the laser system.

Figure 2B:
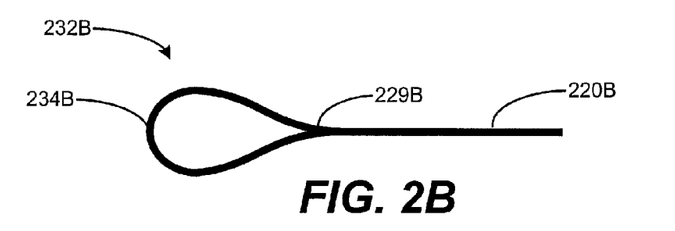

FIG. 2B shows a teardrop reflector 232B coupled to the waveguide 220B via a y-branch 229B. Teardrop reflector 232B may equally split a light beam from the waveguide into two streams based on the y-branch 229B and teardrop 234B, and may reroute the split streams back to the same waveguide simultaneously. Although examples are shown with a y-branch, other combiners may be used in place of the y-branch, e.g., multimode interferometer (MMI), directional coupler, or other connector. The teardrop reflector 232B may split the beam unevenly, and may support the entire wavelength range or a subset. The teardrop reflector 232B, including the teardrop 234B and y-branch 229B may be fabricated on-chip, such as by patterning using photolithography.

Figure 2C:
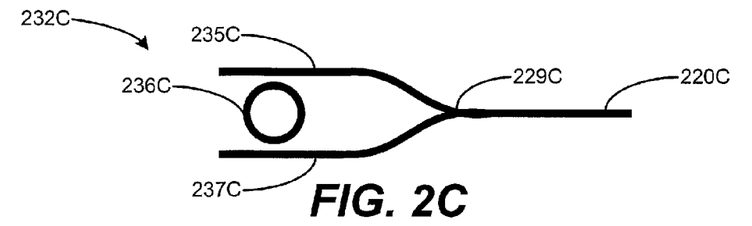

FIG. 2C shows a passive ring reflector 232C coupled to the waveguide 220C. Passive ring reflector 232C may include passive ring 236C, y-branch 229C, upper waveguide 235C, and lower waveguide 237C. The passive ring reflector 232C may include functionality similar to the teardrop reflector 232B. The passive ring reflector 232C also may function as a wavelength-selective add/drop component. The passive ring reflector 232C may include a resonance wavelength to be reflected, and may pass other wavelengths. For example, the passive ring reflector 232C may match its resonance wavelength with certain lasing wavelengths, such as the primary lasing wavelength(s) of the active ring. Thus, the passive ring reflector 232C may reflect only primary wavelength(s) $\lambda_0$, and allow other lasing wavelengths ($\lambda_1$, $\lambda_2$, $\lambda_3$, ...) to be emitted from the open ports of the upper waveguide 235C and lower waveguide 237C. The passive ring reflector 232C may trigger domination of unidirectional lasing at a particular wavelength ($\lambda_0$) associated with the passive ring reflector 232C, even when the active ring supports multiple lasing wavelengths. Accordingly, the light power reflected and coupled back into the active ring resonator cavity may trigger the domination of unidirectional lasing and light emission to the desired output port of the laser, providing single-wavelength unidirectionally dominated lasing. Thus, the passive ring reflector 232C may enable single-wavelength output for ring lasers that would otherwise lase in multiple wavelengths, such as long-cavity ring lasers having a small free spectral range (FSR). The reflection bandwidth of the passive ring reflector 236C may be chosen to be much smaller than one FSR of the active ring laser.

Figure 2D:
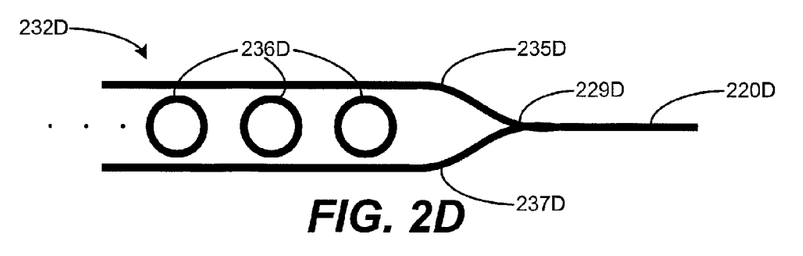

FIG. 2D shows a passive ring reflector 232D coupled to the waveguide 220D, including a plurality of passive rings 236D, y-branch 229D (or other combiner), upper waveguide 235D, and lower waveguide 237D. The ring reflector 232D may provide similar benefits as described above regarding passive ring reflector 232C, with the additional features of enabling multiple specific wavelengths to be reflected by each of the plurality of passive rings 236D. The reflection bandwidth of the ring reflector 232D may be increased and/or flattened compared to a reflector based on a single passive ring, e.g., by vertically coupling the array of passive rings 236D between the upper waveguide 235D and lower waveguide 237D via the y-branch 229D. The large reflection bandwidth of the ring reflector 232D enables that reflector to trigger unidirectionally dominated lasing for multiple active rings coupled to the waveguide 220D.

Figure 2E:
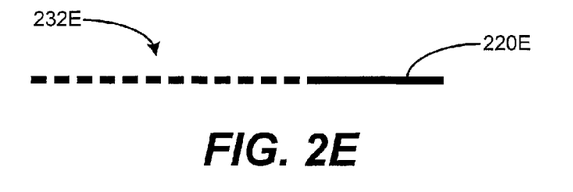

FIG. 2E shows a Distributed Bragg Reflector (DBR) 232E coupled to the waveguide 220E. The DBR 232E may provide single-wavelength lasing features similar to the passive ring reflector 236C, including designing the reflection bandwidth of the DBR 232E for long-cavity ring lasers having small FSR that usually lase in multiple wavelengths, such as designing the reflection bandwidth to be much smaller than one FSR of the ring laser. The reflection bandwidth of the DBR 232E may be increased and/or flattened by using a short and high-index-contrast grating structure for the DBR 232E, making the DBR 232E perform similarly to the teardrop reflector 234B. Thus, similar to other reflector examples shown throughout, a single DBR 232E may be used to trigger domination of unidirectional lasing in a bank of active ring lasers coupled to the waveguide 220E.

Figure 3:
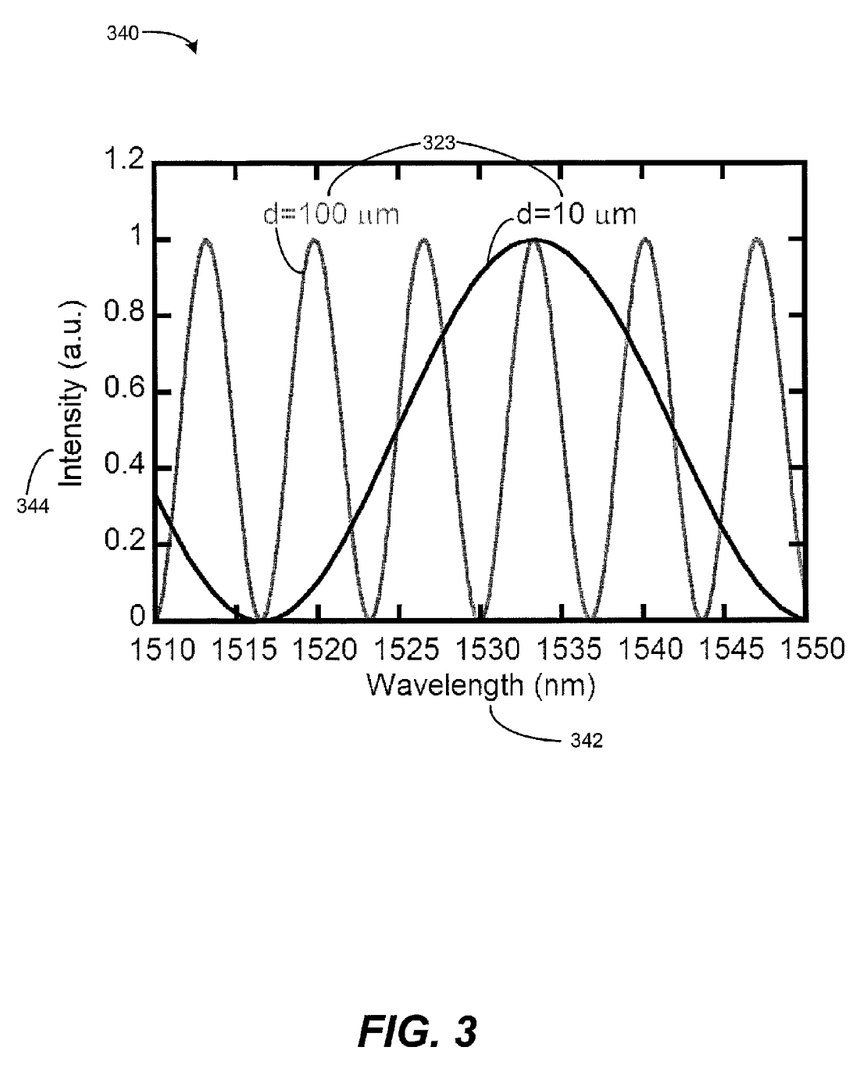
FIG. 3 is a chart of a phase condition of a laser according to an example.

FIG. 3 is a chart of a phase condition 340 of a laser according to an example. The phase condition 340 is shown in terms of wavelength 342 and intensity 344, for distance d 323 of 10 microns (solid black curve) and 100 microns (gray curve). Distance d 323 corresponds to the distance along the waveguide between the reflector and coupling point, e.g., as shown in FIG. 1 regarding reflector 130 and coupling point 122.

The behavior shown in FIG. 3 may arise due to interference in a waveguide, where reflected counterclockwise light (e.g., 125 in FIG. 1) meets clockwise light (e.g., 112 in FIG. 1) such as at the coupling point of the waveguide. Thus, the interference is affected by the optical length between the reflector and the ring-waveguide coupling point, i.e., d 323. Depending on the phase condition, which is related to d 323 and laser wavelength 342, constructive and/or destructive interference may occur, as shown in FIG. 3.

High values for intensity 344, such as peaks where intensity 344 is approximately equal to 1 a.u., correspond with constructive interference. Low values for intensity 344, such as valleys where intensity 344 is approximately 0 a.u., correspond to destructive interference. Thus, distance d 323 may be chosen in view of wavelength 342 to result in a peak at a desired wavelength 342. For example, a lasing wavelength 342 associated with the domination of unidirectional lasing of approximately 1540 nm may provide a peak intensity 344 when d 323 is chosen to be 100 µm.

The value for d 323 also may be chosen to provide a large optical bandwidth. In the example above, where d 323 was chosen to be 100 μm, the peak at approximately 1540 nm is sharp and falls off rapidly as the wavelength 342 deviates from 1540 nm. Accordingly, the value of distance 323 of 100 μm may result in a shorter bandwidth wherein intensity 344 falls off as wavelength 342 fluctuates.

In contrast to a large value of d 323 such as 100 μm, a shorter value of d 323 may provide larger optical bandwidth more tolerant of fluctuations in lasing wavelength 342. Thus, constructive interference may be maintained at a larger range of wavelengths 342, allowing for the lasing wavelength 342 to fluctuate while still providing high intensity 344. For example, consider d 323 of 100 μm and a wavelength 342 of 1533 nm where intensity 344 is approximately 1. The intensity 344 is maintained approximately above 0.8 a.u., even if the wavelength 342 fluctuates by approximately ±5 nm. In examples described below, d may vary for multiple rings sharing a reflector and/or waveguide where each ring is coupled at a different distance from the shared reflector. In other examples described below, d may be chosen for each ring associated with its own reflector, even if multiple rings are coupled to the same waveguide, by adjusting the reflector position relative to its associated ring and/or side waveguide.

Figure 4:
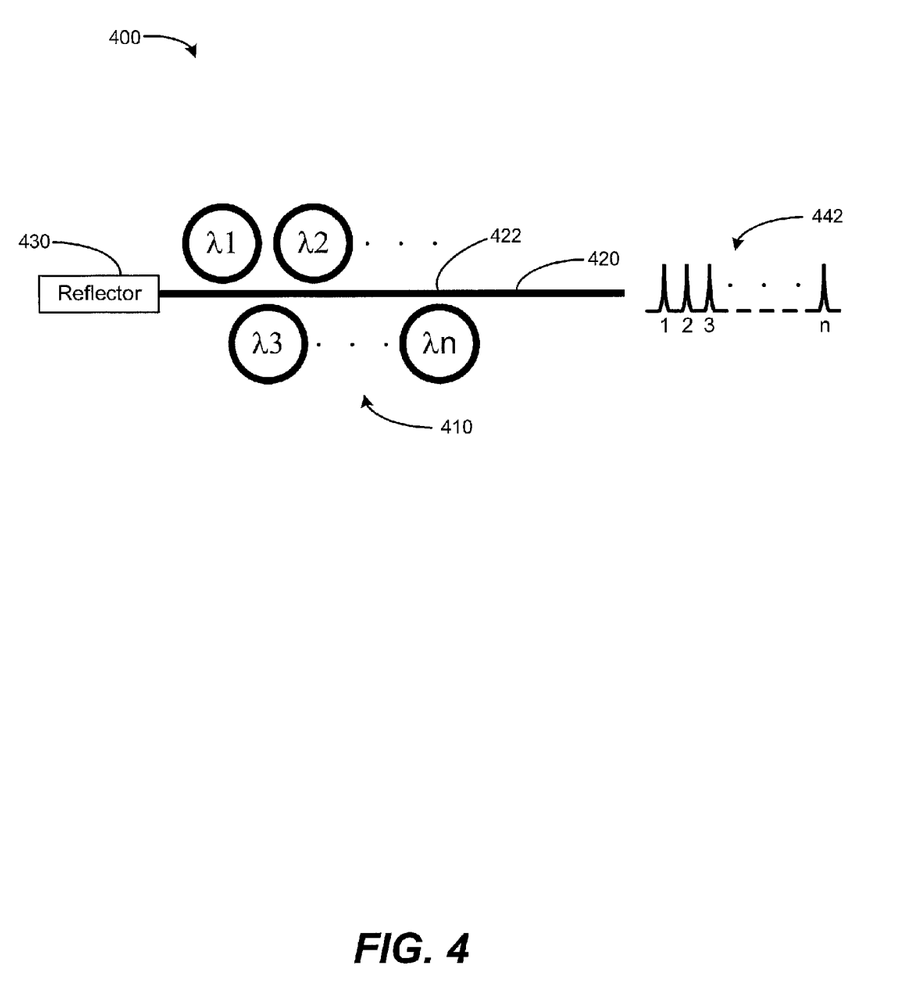
FIG. 4 is a block diagram of a laser array including a reflector according to an example.

FIG. 4 is a block diagram of a laser array 400 including a reflector 430 according to an example. The laser array 400 includes a plurality of n active rings 410 coupled to the waveguide 420. The rings 410 enable output of a plurality of corresponding wavelengths 442. The rings 410 may share one waveguide 420, and may be triggered into domination of unidirectional lasing based on one reflector 430.

The laser array 400 may be used to provide a wavelength division multiplexing (WDM) light source, including n active rings 410 to output n wavelengths. The laser array 400 enables avoidance of cross-talk between different wavelengths, because each of the n active rings 410 is excited by a different wavelength. The rings 410 may be arranged such that the distance $d_n$ between the reflector 430 and the coupling point 422 for that ring provides a desired phase condition (e.g., constructive interference) in view of the wavelength $\lambda_n$ for that ring. In an example, an arrangement of the n active rings 410 may provide some rings with constructive interference and some rings with destructive interference. In an example, an arbitrary number of active rings may be added to the waveguide 420, e.g., to provide multi-channel WDM, and the one reflector may include a reflection bandwidth to reflect wavelengths to enable domination of unidirectional lasing in all the active rings.

Figure 5:
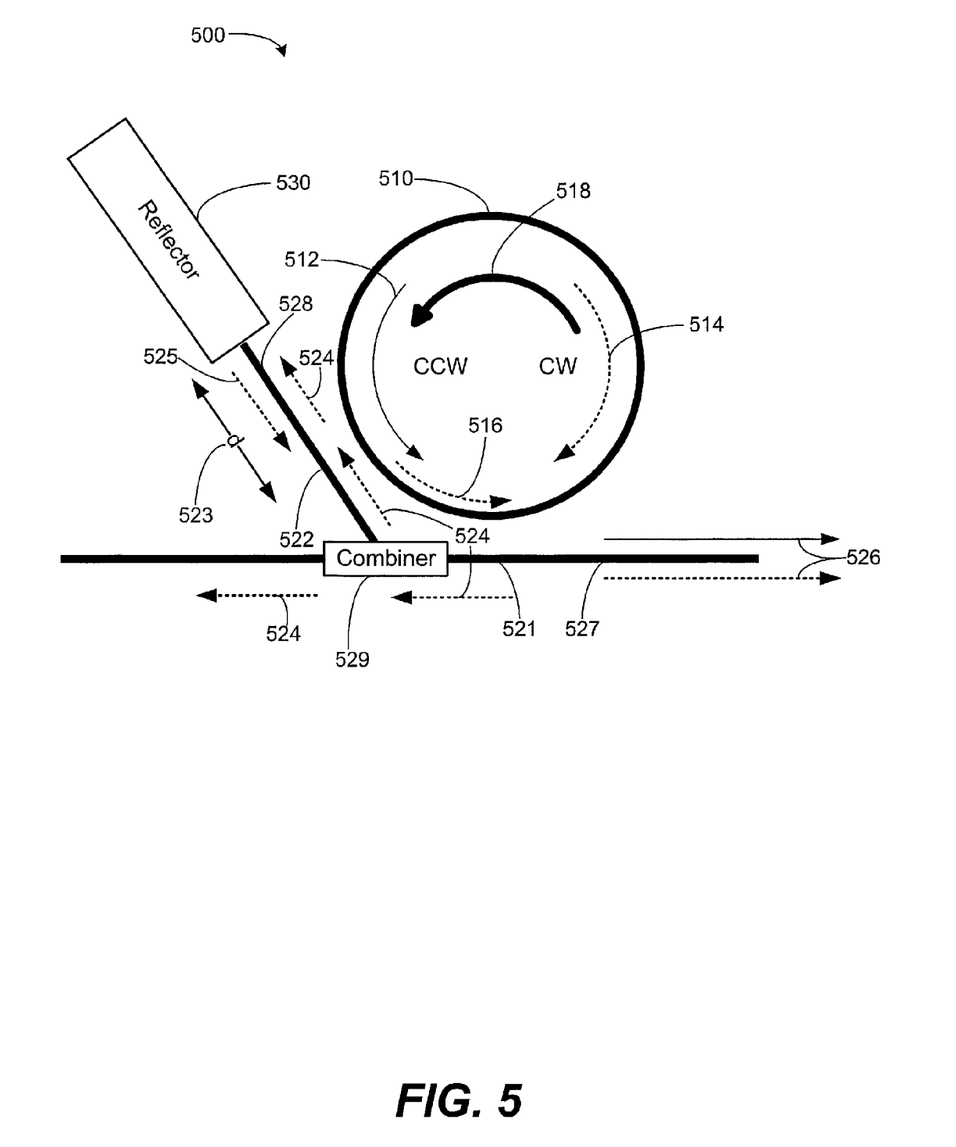
FIG. 5 is a block diagram of a laser including a reflector according to an example.

FIG. 5 is a block diagram of a laser 500 including a reflector 530 according to an example. The waveguide includes a main waveguide 527 and a side waveguide 528 coupled to each other via a combiner 529. Combiner 529 may be a y-branch, multimode interferometer (MMI), directional coupler, or other connector. The side waveguide 528 is shown coupled to the main waveguide 527 at an angle, and may be coupled at any angle including 90 degrees, acute, or obtuse angles. Reflector 530 is associated with side waveguide 528. The side waveguide 528 is coupled to active ring 510 at side coupling point 522. The reflector 530 is positioned a distance d 523 from the side coupling point 522. The active ring 510 also may be coupled to the main waveguide 527 via a main coupling point 521.

The laser 500 is to provide emitted light 526 to/from the main waveguide 527 based on triggered domination of unidirectional lasing 518 consistent with the desired direction of emitted light 526. Reflector 530 and side waveguide 528 may be used to trigger domination of unidirectional lasing 518 in the active ring 510.

Light from clockwise 514 light generation may be coupled to the side waveguide 528 (and/or main waveguide 527) as captured light 524. Reflector 530 may reflect the captured light 524 as reflected light 525. The reflected light 525 may be coupled into the main waveguide 527, and may be coupled into the active ring 510 as coupled light 516. Coupled light 516 traveling in the counterclockwise 512 direction is to trigger domination of unidirectional lasing 518 in the active ring 510.

Figure 6:
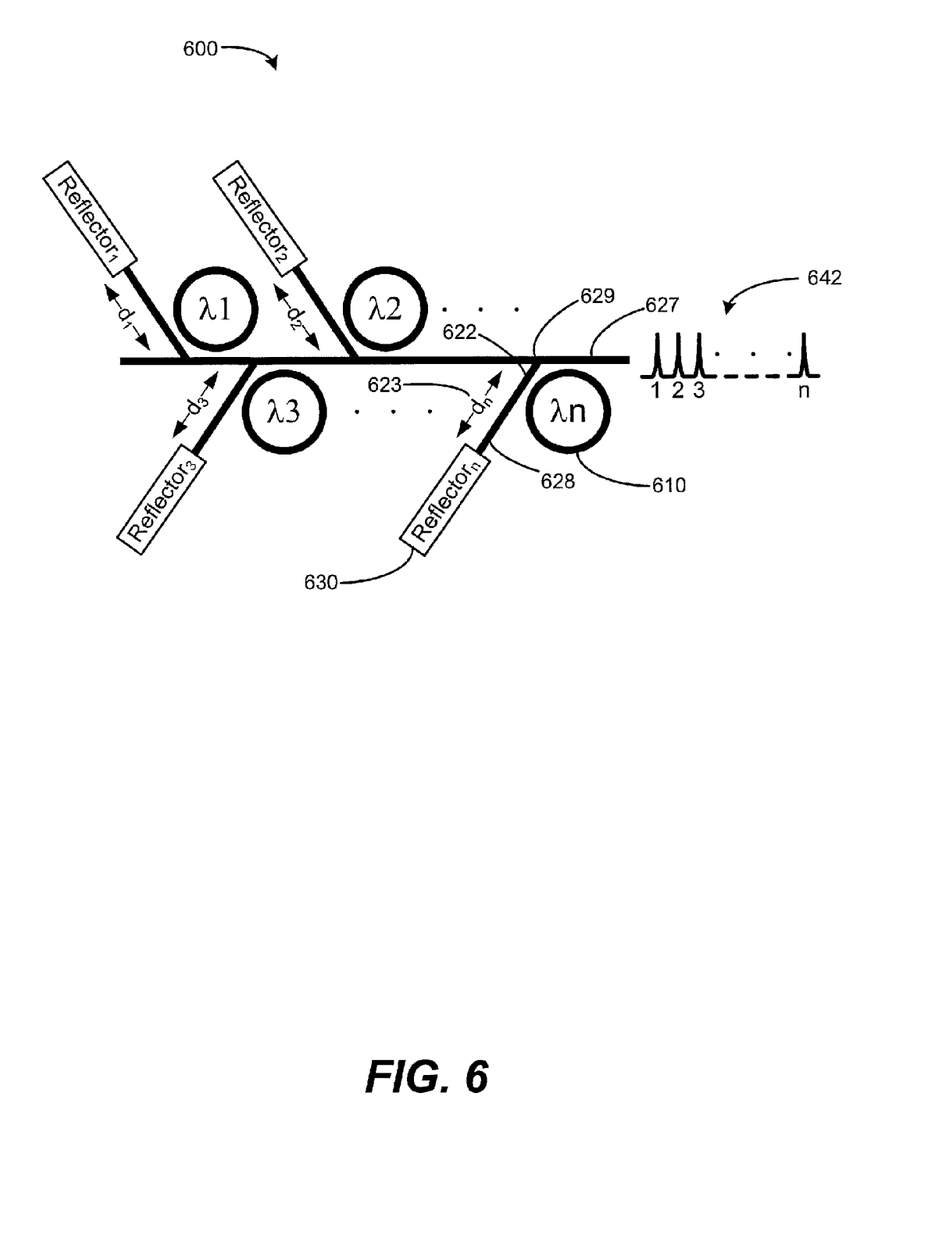
FIG. 6 is a block diagram of a laser array including a plurality of reflectors according to an example.

FIG. 6 is a block diagram of a laser array 600 including a plurality of reflectors 630 according to an example. The laser array 600 includes a plurality of n active rings 610 coupled to a plurality of n side waveguides 628. The n side waveguides 628 are each coupled to a corresponding one of the n reflectors 630 at a distance $d_n$ from a corresponding side coupling point 622. Each side waveguide 628 is coupled to main waveguide 627 via a combiner, shown as a y-branch 629 in the example of FIG. 6 (although other combiners may be used). The y-branch 629 can enable reflected light from the reflector, that is not coupled back into its corresponding ring in side waveguide 628, to enter the main waveguide 627 to become part of the light output.

The rings 610 enable output of a plurality of corresponding wavelengths 642. Each ring 610 may be associated with its corresponding reflector 630 based on a corresponding distance $d_n$, enabling each ring 610 to provide enhanced efficiency by tailoring a phase condition according to the wavelength for that particular ring 610 in view of the distance d 623 associated with that ring 610. Each reflector may be provided at a short distance d 623 from the coupling point, such that each ring may provide light with constructive interference over a wide bandwidth of wavelength values/fluctuations.

Figure 7:
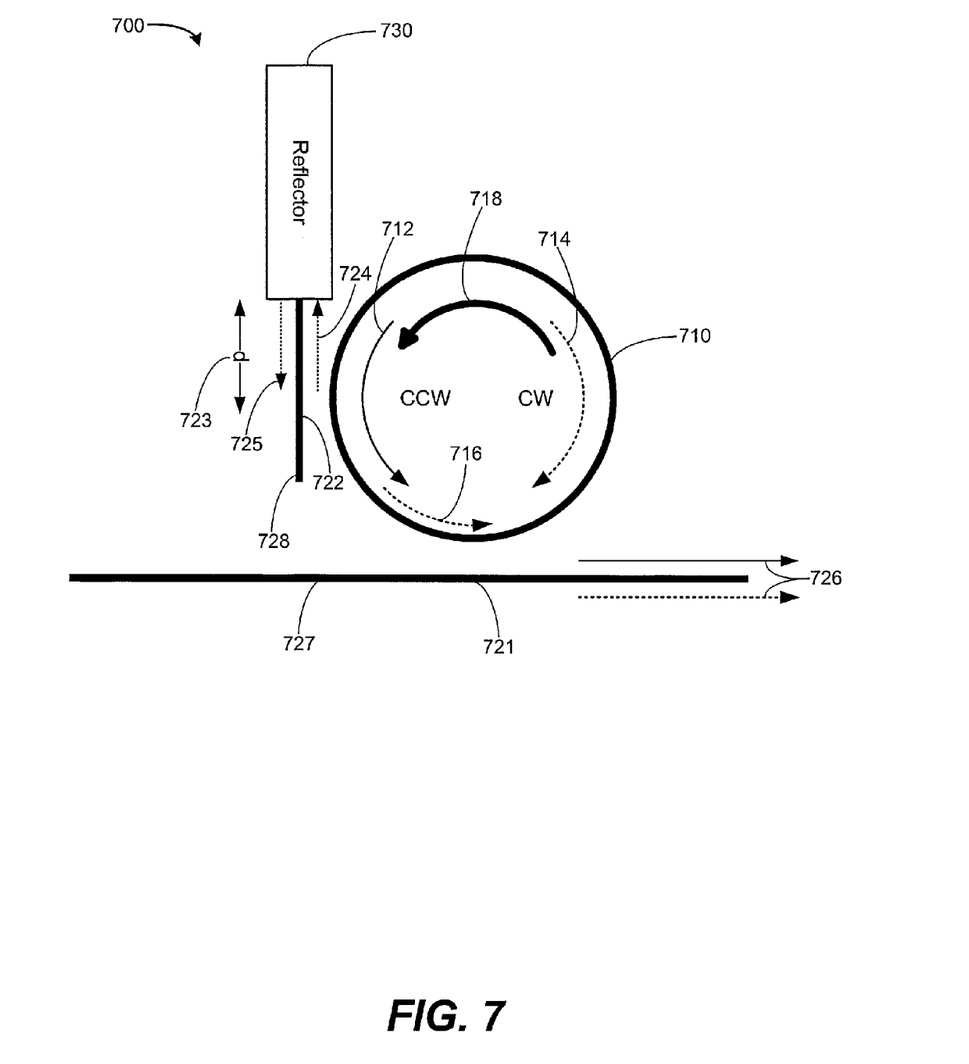
FIG. 7 is a block diagram of a laser including a reflector according to an example.

FIG. 7 is a block diagram of a laser 700 including a reflector 730 according to an example. The waveguide includes main waveguide 727 and side waveguide 728 spaced from each other. Reflector 730 is associated with side waveguide 728. The side waveguide 728 is coupled to active ring 710 at side coupling point 722. The reflector 730 is positioned a distance d 723 from the side coupling point 722. The active ring 710 also may be coupled to the main waveguide 727 via a main coupling point 721.

The laser 700 is to provide emitted light 726 to/from the main waveguide 727 based on triggered domination of unidirectional lasing 718 consistent with the desired direction of emitted light 726. Reflector 730 and side waveguide 728 may be used to trigger domination of unidirectional lasing 718 in the active ring 710.

Light from clockwise 714 light generation may be coupled to the side waveguide 728 (and/or main waveguide 727) as captured light 724. Reflector 730 may reflect the captured light 724 as reflected light 725. The reflected light 725 may be coupled into the active ring 710 as coupled light 716. Coupled light 716 traveling in the counterclockwise 712 direction is to trigger domination of unidirectional lasing 718 in the active ring 710.

Figure 8:
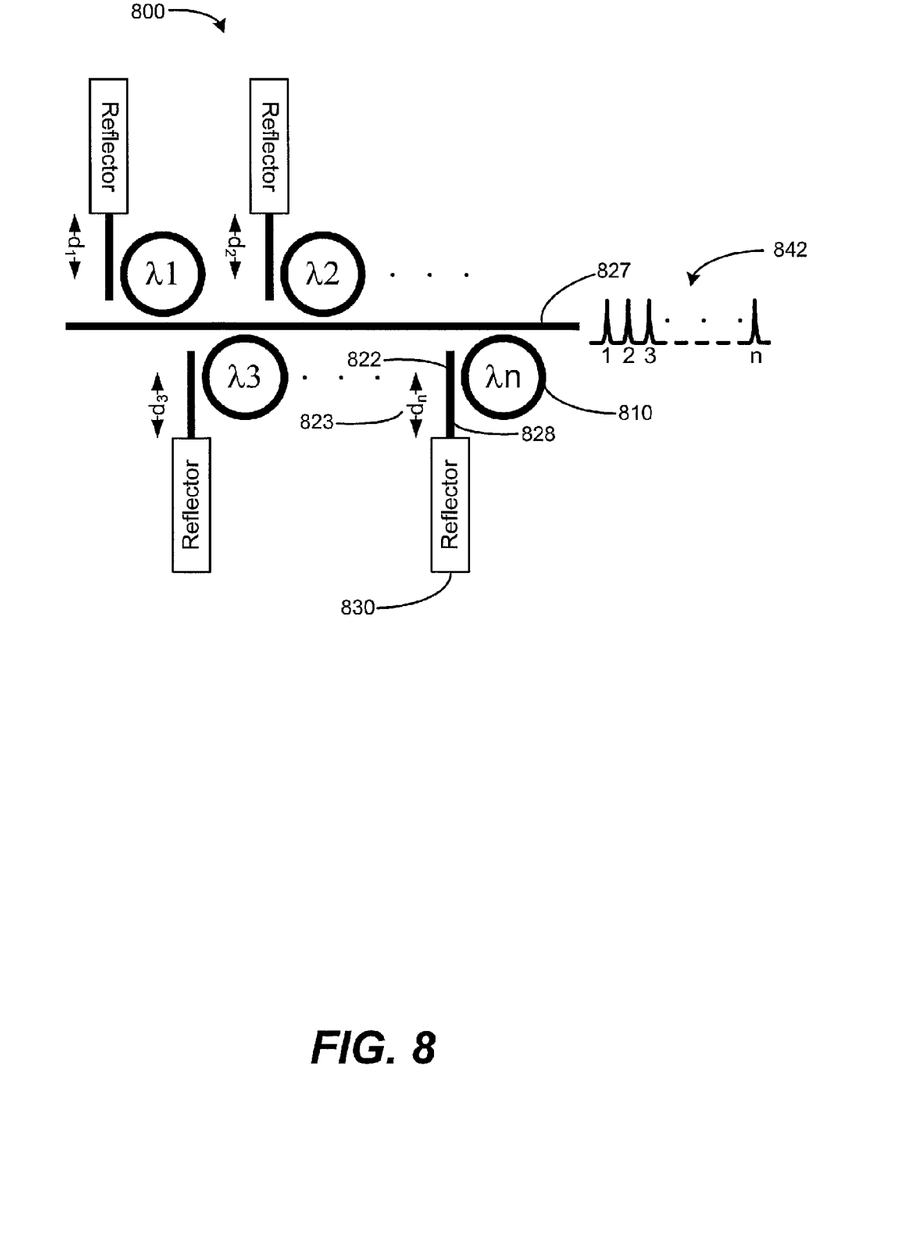
FIG. 8 is a block diagram of a laser array including a plurality of reflectors according to an example.

FIG. 8 is a block diagram of a laser array 800 including a plurality of reflectors 830 according to an example. The laser array 800 includes a plurality of n active rings 810 each coupled to a plurality of n side waveguides 828. The n side waveguides 828 are each coupled to a corresponding reflector 830 at a distance $d_n$ from a corresponding side coupling point 822. Each side waveguide 828 is separated from main waveguide 827.

The rings 810 enable output of a plurality of corresponding wavelengths 842. Each ring 810 may be associated with its corresponding reflector 830 based on a corresponding distance $d_n$, enabling each ring 810 to provide enhanced efficiency by tailoring a phase condition according to the wavelength for that particular ring 810 in view of the distance d 823 associated with that ring 810.

Figure 9:
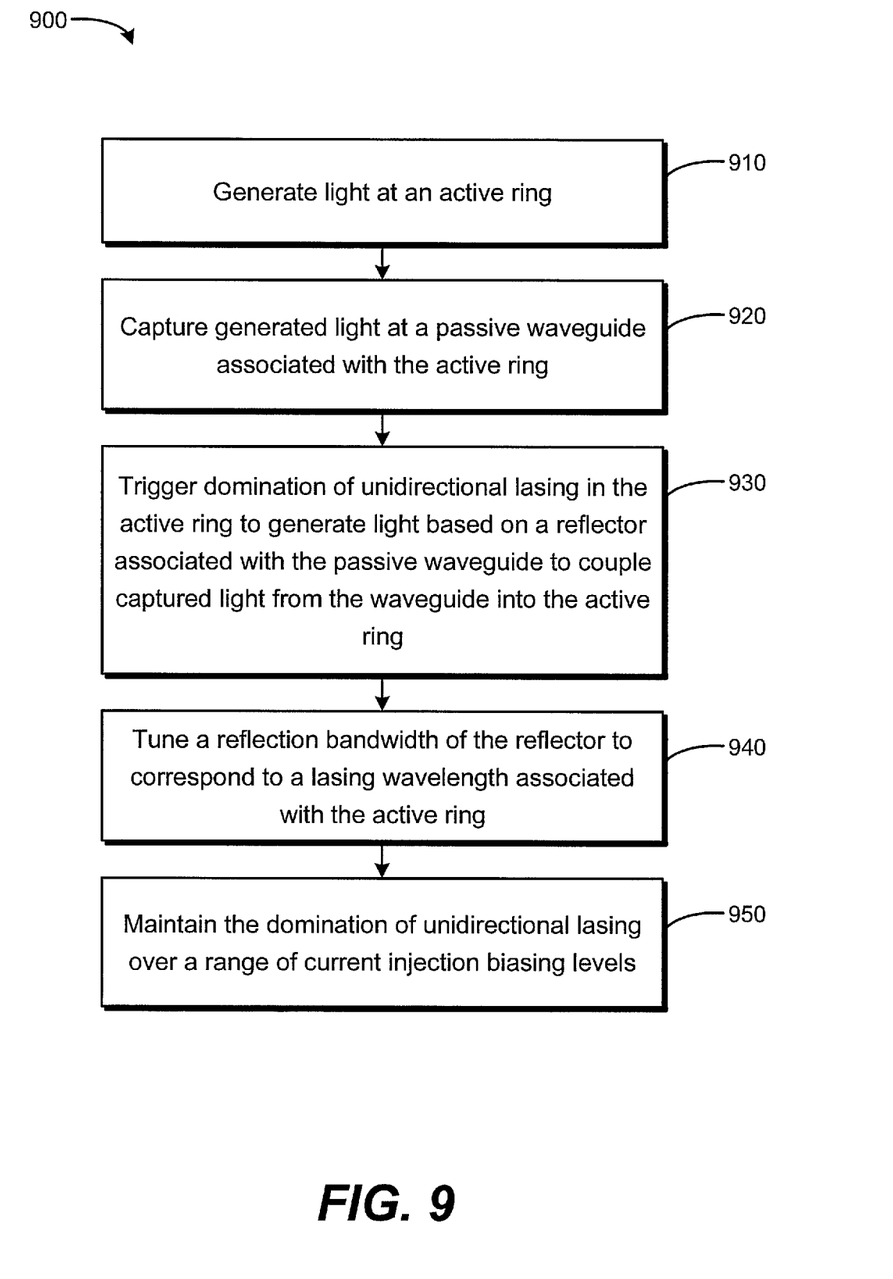
FIG. 9 is a flow chart based on generating light at an active ring according to an example.

FIG. 9 is a flow chart 900 based on generating light at an active ring according to an example. In block 910, light is generated at an active ring. For example, an active ring may include a gain medium that responds to optical pumping and/or electrical pumping (e.g., an injection current). In block 920, generated light is captured at a passive waveguide associated with the active ring. The passive waveguide may be coupled to the active ring at a coupling point. The passive waveguide may include a side waveguide and a main waveguide, and the passive waveguide may be coupled to the active ring via the side waveguide and/or the main waveguide. The side waveguide may be separate from the main waveguide, and/or the side waveguide may be coupled to the main waveguide (e.g., via a y-branch).

In block 930, domination of unidirectional lasing is triggered in the active ring to generate light based on a reflector associated with the passive waveguide to couple captured light from the waveguide into the active ring. In an example, the reflector is to reflect light in the waveguide from the non-dominant direction to the dominant direction, and the reflected light is coupled into the active ring to trigger unidirectional lasing in the active ring. Thus, light generated in the active ring due to unidirectional lasing in the dominant direction may be coupled to and output from the passive waveguide at high intensity. In block 940, a reflection bandwidth of the reflector is tuned to correspond to a lasing wavelength associated with the active ring. In an example, the reflector may include a tunable passive ring that reflects a wavelength to trigger domination of unidirectional lasing in the active ring. In step 950, domination of unidirectional lasing is maintained over a range of current injection biasing levels. For example, the active ring may unidirectionally lase in response to a variety of levels of external energy pumping.

What is claimed is:

1. A laser, comprising:
   an active ring to generate a light;
   a passive waveguide associated with the active ring for capturing a captured light of the light that is generated; and
   a reflector associated with the passive waveguide to cause the captured light from the waveguide to be coupled into the active ring to trigger a domination of unidirectional lasing of the light in the active ring,
   wherein the reflector is tunable to adjust a reflection bandwidth of a lasing wavelength associated with the active ring.

2. The laser of claim 1, wherein the passive waveguide includes a coupling point, at a distance from the reflector, associated with a phase condition based on the distance and a laser wavelength, to provide a constructive interference over an optical bandwidth.

3. The laser of claim 1, wherein the active ring includes a gain medium responsive to an external energy pump to generate the light.

4. The laser of claim 1, wherein the reflector includes a facet reflector having a reflection coating.

5. The laser of claim 1, wherein the reflector includes a teardrop reflector.

6. The laser of claim 1, wherein the reflector includes a passive ring reflector.

7. The laser of claim 1, wherein the reflector includes a distributed bragg reflector (DBR).

8. A laser, comprising:
   at least one active ring to generate a light in response to an external energy pump;
   a passive waveguide associated with the at least one active ring for capturing a captured light of the light based on a coupling point; and
   at least one reflector associated with the passive waveguide at a distance from the coupling point to cause the captured light from the waveguide to be reflected back into the at least one active ring to trigger a domination of unidirectional lasing in the at least one active ring to generate the light,
   wherein the at least one reflector is tunable to adjust a reflection bandwidth of a lasing wavelength associated with the at least one active ring.

9. The laser of claim 8, wherein the at least one active ring comprises a plurality of active rings associated with the passive waveguide, wherein each of the plurality of active rings is for generating a respective light having a different wavelength.

10. The laser of claim 9, wherein the at least one reflector comprises a plurality of reflectors, wherein each one of the plurality of reflectors is associated with one of the plurality of active rings.

11. The laser of claim 10, wherein each one of the plurality of reflectors causes a constructive interference at the different wavelength of a respective captured light.

12. A method, comprising:
    generating a light at an active ring;
    capturing a captured light of the light that is generated at a passive waveguide associated with the active ring;
    triggering a domination of unidirectional lasing in the active ring to generate the light based on a reflector associated with the passive waveguide to couple the captured light from the waveguide into the active ring; and
    tuning the reflector to adjust a reflection bandwidth associated with a lasing wavelength of the active ring.

13. The method of claim 12, wherein the passive waveguide comprises a main waveguide and a side waveguide.

14. The method of claim 13, wherein the side waveguide is separate from the main waveguide.

* * * * *